United States Patent
Kim et al.

(10) Patent No.: US 8,487,413 B2
(45) Date of Patent: Jul. 16, 2013

(54) PASSIVATION FILM FOR ELECTRONIC DEVICE AND METHOD OF MANUFACTURING THE SAME

(75) Inventors: Yong-Tak Kim, Yongin (KR); Yoon-Hyeung Cho, Yongin (KR); Min-Ho Oh, Yongin (KR); Byoung-Duk Lee, Yongin (KR); So-Young Lee, Yongin (KR); Seung-Yong Song, Yongin (KR); Jong-Hyuk Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 89 days.

(21) Appl. No.: 13/157,083

(22) Filed: Jun. 9, 2011

(65) Prior Publication Data

US 2012/0098108 A1    Apr. 26, 2012

(30) Foreign Application Priority Data

Oct. 25, 2010    (KR) ................. 10-2010-0104184

(51) Int. Cl.
*H01L 23/58* (2006.01)

(52) U.S. Cl.
USPC .................. 257/640; 257/E29.006; 438/761

(58) Field of Classification Search
USPC ............ 257/640, E29.006, E21.293; 438/761
See application file for complete search history.

(56) References Cited

U.S. PATENT DOCUMENTS

| | | | |
|---|---|---|---|
| 2003/0137325 A1 | 7/2003 | Yamazaki et al. | |
| 2004/0076835 A1* | 4/2004 | Watanabe | 428/432 |
| 2004/0246424 A1 | 12/2004 | Sawasaki et al. | |
| 2009/0035918 A1* | 2/2009 | Chen et al. | 438/435 |
| 2009/0053426 A1* | 2/2009 | Lu et al. | 427/540 |
| 2009/0176380 A1 | 7/2009 | Shimazu et al. | |
| 2009/0197376 A1 | 8/2009 | Kohno et al. | |
| 2009/0309486 A1 | 12/2009 | Imai et al. | |
| 2011/0248313 A1* | 10/2011 | Tsuchiya et al. | 257/100 |

FOREIGN PATENT DOCUMENTS

| | | |
|---|---|---|
| KR | 19980045979 | 5/2000 |
| KR | 20030064303 | 7/2003 |
| KR | 20040084720 | 10/2004 |
| KR | 10-2005-0029790 | 3/2005 |
| KR | 10-2005-0085779 | 8/2005 |
| KR | 20060001464 | 1/2006 |
| KR | 20080073320 | 8/2008 |
| KR | 20090009931 | 1/2009 |
| KR | 20090015158 | 2/2009 |
| KR | 10-2010-0071657 | 6/2010 |
| WO | 2004/057653 | 7/2004 |

OTHER PUBLICATIONS

Office Action dated May 30, 2012 in Korean priority Patent Application No. 10-2010-0104184.
Registration Determination Certificate dated Dec. 28, 2012 in Korean Priority Application No. 10-2010-0104184.

* cited by examiner

*Primary Examiner* — Phuc Dang
(74) *Attorney, Agent, or Firm* — Knobbe Martens Olson & Bear LLP

(57) ABSTRACT

Disclosed are a passivation film for an electronic device having a nitride film formed on a substrate by a plasma-enhanced chemical vapor deposition (PECVD) method using a silicon-containing gas and a nitrogen-containing gas and a plasma-processed film formed by plasma processing a surface of the nitride film by a PECVD method using an $NH_3$ gas, an $N_2$ gas, and a $H_2$ gas, and a method of manufacturing the passivation film.

16 Claims, 9 Drawing Sheets

PASSIVATION FILM FOR ELECTRONIC DEVICE AND METHOD OF MANUFACTURING THE SAME

CROSS-REFERENCE TO RELATED APPLICATIONS

This application claims the benefit of Korean Patent Application No. 10-2010-0104184, filed on Oct. 25, 2010, in the Korean Intellectual Property Office, the disclosure of which is incorporated herein in its entirety by reference.

BACKGROUND

1. Field

The present disclosure relates to a passivation film for an electronic device, and more particularly, to a passivation film having a film plasma-processed by a plasma-enhanced chemical vapor deposition (PECVD) method, and a method of manufacturing the passivation film for an electronic device.

2. Description of the Related Technology

A plasma-enhanced chemical vapor deposition (PECVD) method is a method of depositing a thin film on a surface of a substrate by effectively generating a chemical reaction of an injection gas by supplying plasma formed through collision of electrons having high energy into a chamber. In the PECVD method, since a chemical reaction is promoted using plasma, a significant amount of heat required for generating a chemical reaction can be reduced, and thus, substrate damage due to heat can be reduced The PECVD method is used for manufacturing thin films, such as insulating films, metal films, or organic films of organic light-emitting devices or liquid crystal display devices used for semiconductor devices or flat panel display devices.

A passivation film formed on an organic light-emitting device generally has a compressive stress, and when there is a high compressive stress, a product failure, such as a film exfoliation, may be caused. To prevent this problem, the film stress is reduced by depositing a film having a tensile stress using ozone-tetraethoxysilane ($O_3$-TEOS) or by alternately depositing inorganic films and organic films using the organic films.

However, in the case of a film formed by using $O_3$-TEOS, the film is not sufficiently dense to prevent the penetration of moisture and oxygen. In the case of the organic film, there is a concern that the organic film may perform as a penetration path of moisture instead of preventing the penetration of moisture or oxygen. Accordingly, there is a need to develop a method that can mitigate the stress of a passivation film and can effectively block the penetration of moisture and oxygen.

SUMMARY OF CERTAIN INVENTIVE ASPECTS

To address the above and/or other problems, embodiments of the present invention provide a passivation film having a mitigated film-stress and high capability of blocking moisture and oxygen penetration with a passivation film which includes at least two films and where each of the gaps between the films is plasma processed.

The present disclosure also provides a method of manufacturing the passivation film for an electronic device.

According to one aspect, there is provided a passivation film for an electronic device including a nitride film formed on a substrate by using a silicon-containing gas and a nitrogen-containing gas, and a plasma-processed film formed by plasma processing a surface of the nitride film using an $NH_3$ gas, an $N_2$ gas, and a $H_2$ gas.

According to another aspect, there is provided a method of manufacturing a passivation film for an electronic device, the method including forming a nitride film on a substrate by a plasma-enhanced chemical vapor deposition (PECVD) method using a silicon-containing gas and a nitrogen-containing gas, and plasma processing a surface of the nitride film by a PECVD method using an $NH_3$ gas, an $N_2$ gas, and a $H_2$ gas.

The passivation film for an electronic device has a mitigated film stress that can be generated during forming a film, and thus, may not cause an exploitation problem and may block the penetration of moisture and oxygen into the electronic device.

BRIEF DESCRIPTION OF THE DRAWINGS

The above and other features and advantages will become more apparent by describing in detail exemplary embodiments with reference to the attached drawings in which.

DETAILED DESCRIPTION OF CERTAIN INVENTIVE EMBODIMENTS

Figure 1:
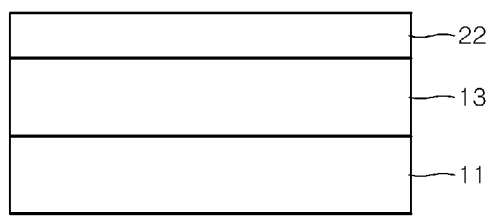
FIG. 1 is a schematic cross-sectional view of an embodiment of a passivation film having a silicon carbon nitride film.

The present invention will now be described more fully with reference to the accompanying drawings in which exemplary embodiments of the invention are shown. In describing the embodiments, when practical descriptions with respect to related known function and configuration may unnecessarily make the disclosure unclear, the descriptions thereof will be omitted. The invention may, however, be embodied in many different forms and should not construed as limited to the exemplary embodiments set forth herein.

In the drawings, thicknesses may be exaggerated for clarity of layers and regions. Like reference numerals are generally used to refer to like elements throughout the specification. When a layer, a film, a region, or a panel is referred to as being "on" another element, it can be directly on the other layer or substrate, or intervening layers may also be present.

FIG. 1 is a schematic cross-sectional view of an embodiment of a passivation film for an electronic device having a silicon carbon nitride film.

Referring to FIG. 1, the passivation film includes a nitride film 13 formed on a substrate 11 by using a plasma-enhanced chemical vapor deposition (PECVD) method, and a plasma-processed film 22 formed on a surface of the nitride film 13 by a PECVD method.

The substrate 11 denotes a lower substrate which may have a semiconductor device, an organic light-emitting device, or a liquid crystal display device formed thereon. The passivation film physically protects the substrate 11 by covering the substrate 11, and prevents moisture and oxygen from penetrating into the substrate 11.

The nitride film 13 may be an inorganic material film that does not easily exfoliate and crack and may prevent the penetration of moisture and oxygen into the substrate 11. The nitride film 13 may be a silicon nitride film or a silicon carbon nitride film. The silicon nitride film may be formed by using a PECVD method using a silicon-containing gas or a nitrogen-containing gas. The silicon carbon nitride film may be formed by using the PECVD method further using a hydrocarbon gas.

The silicon-containing gas may be a silane gas, such as mono silane $SiH_4$, dichloro-silane (DCS) $SiH_2Cl_2$, hexachlorodisilane (HCD) $Si_2Cl_6$, or bistertialbutylaminosilane (BT-BAS) $SiH_2 (NH(C_4H_9))_2$. The nitrogen-containing gas may be an $N_2$ gas or an $NH_3$ gas. However, raw gases for forming the silicon nitride film are not limited thereto, and any raw gas may be used in other embodiments. The silicon nitride film may be formed by a PECVD method using a combination of a $SiH_4$ gas, a $H_2$ gas, and an $N_2$ gas.

The plasma-processed film 22 is formed by plasma processing a predetermined thickness of a surface of the nitride film 13. The plasma-processed film 22 is formed by plasma processing the surface of the nitride film 13 by a PECVD method using an $NH_3$ gas, an $N_2$ gas, and a $H_2$ gas. In some embodiments, the plasma-processed film 22 may be formed on the surface of the nitride film 13 by a PECVD method using $NH_3$, $N_2$, $H_2$, $N_2O$, and $O_2$.

As a result of the plasma processing on the surface of the nitride film 13, the amount of Si—H bonds included in the passivation film is reduced, and accordingly, the passivation film becomes dense. Since the plasma processing is performed using a combination gas of an $NH_3$ gas, an $N_2$ gas, and a $H_2$ gas, a high density plasma effect is produced. Therefore, the passivation film shows an increased tensile stress characteristic. If the nitride film 13 before a plasma processing has a compressive stress characteristic, the passivation film having the plasma-processed film 22 may have a lower degree of compressive stress characteristic, or an overall tensile stress characteristic. If the nitride film 13 before a plasma processing has a tensile stress characteristic, the passivation film having the plasma-processed film 22 may have a further increased tensile stress characteristic.

As a result of the plasma processing, nitrogen content in the plasma-processed film 22 is increased. With the nitrogen content in the plasma-processed film 22 increased, the refractive index of the passivation film is reduced, and thus, the transparency of the passivation film is increased. In some embodiments, the passivation film may have a transmissivity of about 70% or above in a visible light region.

The nitride film 13 may have a thickness in a range from about 0.5 to about 1.5 µm. With such a thickness, the nitride film 13 prevents the penetration of moisture and oxygen and thus, may appropriately function as a passivation film. Additionally, a film exfoliation problem is prevented even after a long lapse of time since the compressive stress of a film is not large for such thicknesses.

The plasma-processed film 22 may have a thickness in a range from about 0.02 to about 0.8 µm. With such thicknesses, the nitrogen content in the plasma-processed film 22 may be increased due to the plasma processing, and thus, the refractive index of the plasma-processed film 22 may be reduced. Additionally, the passivation film may appropriately prevent the penetration of moisture and oxygen with such thicknesses.

An embodiment of a method of manufacturing a passivation film for an electronic device will now be described.

The nitride film 13 is formed on the substrate 11 by using a PECVD method using a silicon-containing gas or a nitrogen-containing gas. In some embodiments, the nitride film 13 having a thickness in a range from about 0.5 to about 1.5 µm is formed by using the PECVD method using a $SiH_4$ gas, a $H_2$ gas, and an $N_2$ gas. The nitride film 13 may be a silicon nitride film or a silicon carbon nitride film, but not limited thereto.

Next, a surface of the nitride film 13 is plasma processed. A gas used for plasma processing may be an $NH_3$ gas, an $N_2$ gas, and a $H_2$ gas, but not limited thereto. In some embodiments, $NH_3$, $N_2$, $H_2$, $N_2O$, and $O_2$ may be used. The plasma-processed film 22 may be formed by plasma processing the surface of the nitride film 13 by a PECVD method using an $NH_3$ gas, an $N_2$ gas, and a $H_2$ gas.

In the plasma processing, the amplitude of a radio-frequency (RF) power may be controlled in a range from about 50 to about 1,000 W. With the RF power in this range, the plasma-processed film 22 to be formed may be plasma processed without being etched.

The plasma processing may be performed under a pressure condition in a range from about 0.1 to about 10 torr. With the pressure in this range, plasma may be stable, a film may not be etched and an average travelling distance of ions in plasma may not be too short, and thus, the number of ions that reach the film may be appropriate. Therefore, a plasma processing may be smoothly performed.

The plasma processing may be performed under a temperature in a range from about 50 to about 200° C. of the substrate 11. With a temperature in this range, the mobility of ions is sufficiently increased, and thus, the plasma processing may appropriately affect the characteristic of the plasma-processed film. Additionally, the plasma processing may be performed without damaging an organic material of the substrate 11.

Figure 2:
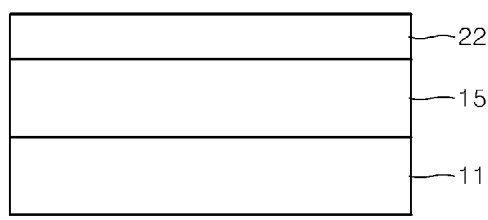
FIG. 2 is a schematic cross-sectional view of another embodiment of a passivation film having a silicon nitride film.

FIG. 2 is a schematic cross-sectional view of another embodiment of the passivation film having a silicon nitride film.

Referring to FIG. 2, the passivation film includes a silicon nitride film 15 formed by using a PECVD method on a substrate 11 and a plasma-processed film 22 plasma processed by using the PECVD method on a surface of the silicon nitride film 15.

The silicon nitride film 15 may be formed on the substrate 11 by a PECVD method using a $SiH_4$ gas, a $H_2$ gas, and an $N_2$ gas as raw gases. The raw gases for forming the silicon nitride film 15 are not limited thereto, and an $NH_3$ gas may be used as a raw gas in some embodiments. The silicon nitride film 15 may have a thickness in a range from about 0.5 to about 1.5 µm. With a thickness in this range, the silicon nitride film 15 prevents the penetration of moisture and oxygen, and thus, may appropriately function as a passivation film. Additionally, a film exfoliation problem may not occur even after a long lapse of time since the compressive stress of film is not too large.

The plasma-processed film 22 may have the same characteristics described with reference to the plasma-processed film 22 of the embodiment of FIG. 1.

Figure 3:
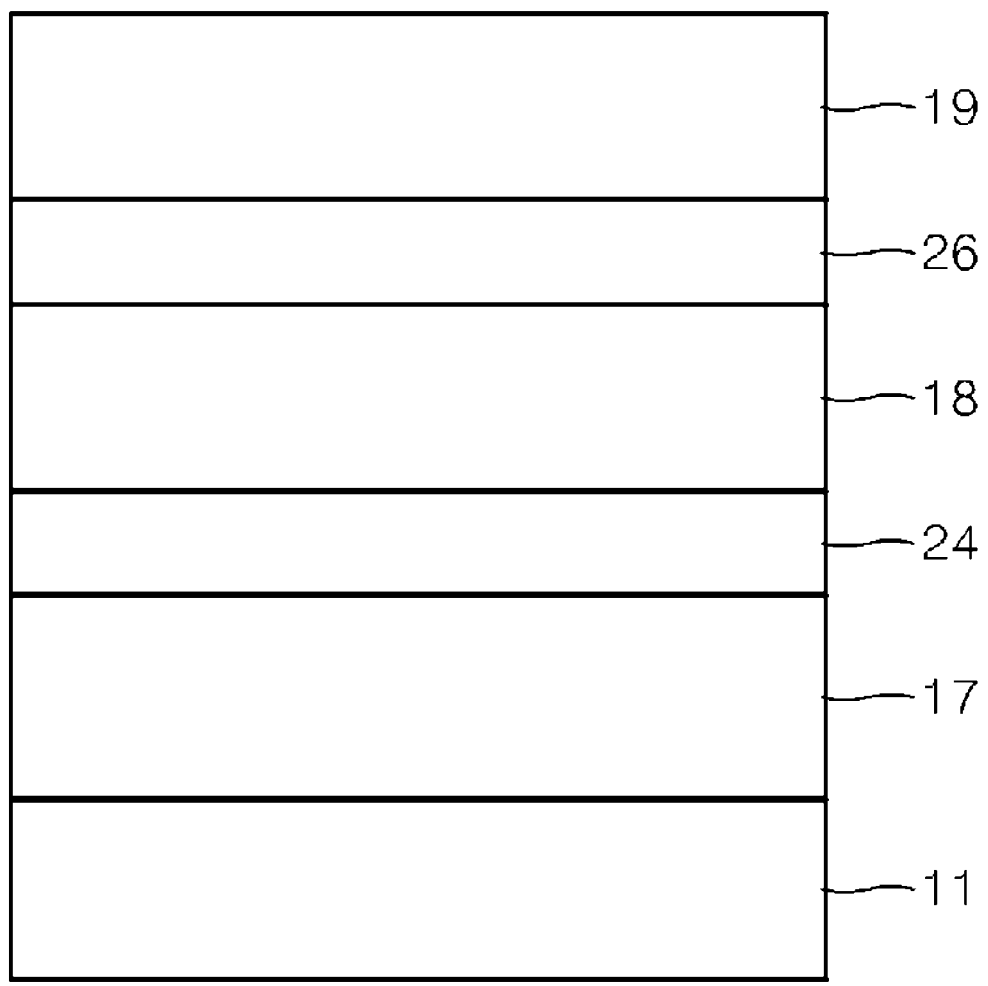
FIG. 3 is a schematic cross-sectional view of another embodiment of a passivation film having a three-layer silicon nitride film.

FIG. 3 is a schematic cross-sectional view of another embodiment of the passivation film having a three-layer silicon nitride film. In the passivation film of FIG. 3, nitride films and plasma-processed films are alternately stacked.

Referring to FIG. 3, the passivation film includes a first nitride film 17 formed on a substrate 11 by using a PECVD method, a first plasma-processed film 24 formed by plasma processing a surface of the first nitride film 17 using the PECVD method, a second nitride film 18 formed on the first plasma-processed film 24 by using the PECVD method, a second plasma-processed film 26 formed by plasma processing a surface of the second nitride film 18, and a third nitride film 19 formed on the second plasma-processed film 26 by using the PECVD method.

The first nitride film 17 may be formed on the substrate 11 by a PECVD method using a $SiH_4$ gas, a $H_2$ gas, and an $N_2$ gas. Raw gases for forming the first nitride film 17 are not limited thereto, and in other embodiments, the first nitride film 17 may be formed using an $NH_3$ gas.

The first plasma-processed film 24 may be formed by plasma processing a surface of the first nitride film 17 by a PECVD method using an $NH_3$ gas, an $N_2$ gas, and a $H_2$ gas. In some embodiments, the first plasma-processed film 24 may be formed by plasma processing a surface of the first nitride film 17 by a PECVD method using $NH_3$, $N_2$, $H_2$, $N_2O$, and $O_2$.

The second nitride film 18 may be formed on the first plasma-processed film 24 by a PECVD method using a $SiH_4$ gas, a $H_2$ gas, and an $N_2$ gas. Raw gases for forming the second nitride film 18 are not limited thereto, and in other embodiments, the second nitride film 18 may be formed using an $NH_3$ gas.

The second plasma-processed film 26 may be formed by plasma processing a surface of the second nitride film 18 by a PECVD method using an $NH_3$ gas, an $N_2$ gas, and a $H_2$ gas. In some embodiments, the second plasma-processed film 26 may be formed by plasma processing a surface of the first second nitride film 18 by a PECVD method using $NH_3$, $N_2$, $H_2$, $N_2O$, and $O_2$.

The third nitride film 19 may be formed on the second plasma-processed film 26 by a PECVD method using a $SiH_4$ gas, a $H_2$ gas, and an N2 gas. Raw gases for forming the third nitride film 19 are not limited thereto, and in other embodiments, the third nitride film 19 may be formed using an $NH_3$ gas.

The sum of thicknesses of the first nitride film 17, the first plasma-processed film 24, the second nitride film 18, the second plasma-processed film 26, and the third nitride film 19 may be in a range from about 0.5 to about 2.5 μm. In some embodiments, the first nitride film 17, the second nitride film 18, and the third nitride film 19 may each have a thickness in a range from about 0.16 to about 0.5 μm, and the first plasma-processed film 24 and the second plasma-processed film 26 may each have a thickness in a range from about 0.01 to about 0.5 μm. With a sum of the thicknesses in the above range, the films may prevent the penetration of moisture and oxygen into the electronic device and a film exfoliation problem may not occur even after a long lapse of time since the compressive stress of the passivation film is not very large.

The structure of the passivation film is not limited thereto, and in other embodiments, the passivation film may have a structure in which a number of nitride films and a number of plasma-processed films are alternately stacked. In some embodiments, the second plasma-processed film 26 and the third nitride film 19 may be omitted.

Working Example 1

A silicon carbon nitride film having a thickness of about 1.0 μm was formed on a substrate equipped with an organic light-emitting device formed thereon, by a PECVD method using a $SiH_4$ gas, a $H_2$ gas, an $N_2$ gas, and a $C_2H_4$ gas. A surface of the silicon carbon nitride film was plasma processed by a PECVD method using an $NH_3$ gas, an $N_2$ gas, and a $H_2$ gas. The plasma processing was performed with an RF power of about 600 W, at pressures of about 1.5, about 1.0, and about 0.5 torr, and at a substrate temperature of about 100° C. until the thickness of the plasma-processed film reached about 0.1 μm.

Table 1 summarizes stresses and refractive indexes according to pressure of the passivation film obtained as above.

TABLE 1

| Pressure (torr) | Stress ($10^9$ dyne/cm²): before→after plasma processing | Refractive index: before→after plasma processing |
| --- | --- | --- |
| 1.5 | Compressive 0.03→ Tensile 0.22 | 1.51→1.49 |
| 1.0 | Tensile 0.04→ Tensile 0.20 | 1.49→1.47 |
| 0.5 | Tensile 0.14→ Tensile 0.40 | 1.48→1.46 |

Referring to Table 1, it is seen that the stress of the passivation film is changed to a tensile characteristic due to the use of high density plasma of a combination gas of an $NH_3$ gas, an $N_2$ gas, and a $H_2$ gas. The compressive characteristic of the passivation film before a plasma processing is changed to a tensile characteristic after plasma processing, or the tensile characteristic of the passivation film before a plasma processing is further increased after plasma processing. There are little refractive index changes before and after the plasma processing of the passivation film. Under a low pressure, the trends of increasing the tensile characteristic and decreasing the refractive index are apparent due to increased mean-moving path of particles, such as NH, $NH_2$, or $N_2$ ions, that constitute the passivation film.

Working Example 2

A silicon nitride film having a thickness of about 1.0 μm was formed on a substrate equipped with an organic light-emitting device formed thereon, by a PECVD method using a $SiH_4$ gas, a $H_2$ gas, and an $N_2$ gas. A surface of the silicon nitride film was plasma processed by a PECVD method using an $NH_3$ gas, an $N_2$ gas, and a $H_2$ gas. The plasma processing was performed with an RF power of about 600 W, at pressures of about 0.5 and about 0.2 torr, and at a substrate temperature of about 100° C. until the thickness of the plasma-processed film reached about 0.1 μm.

Table 2 summarizes stresses and refractive indexes according to pressure of the passivation film obtained as above.

TABLE 2

| Pressure (torr) | Stress ($10^9$ dyne/cm²): before→after plasma processing | Refractive index: before→after plasma processing |
| --- | --- | --- |
| 0.5 | Compressive 1.93 → Compressive 0.55 | 1.78→1.84 |
| 0.2 | Compressive 1.93 → Compressive 0.25 | 1.78→1.85 |

Referring to Table 2, the silicon nitride film before a plasma processing has a compressive stress characteristic since the silicon nitride film is dense, and still has a compressive stress characteristic after the plasma processing. Also, stress values that were compressive before a plasma processing are further reduced after the plasma processing, that is, it is seen that a tensile characteristic is increased after a plasma processing. Also, there are little variations in the refractive indexes of the passivation film before and after a plasma processing. It is seen that the tensile characteristic of the passivation film is increased as the pressure is decreased.

Figure 4:
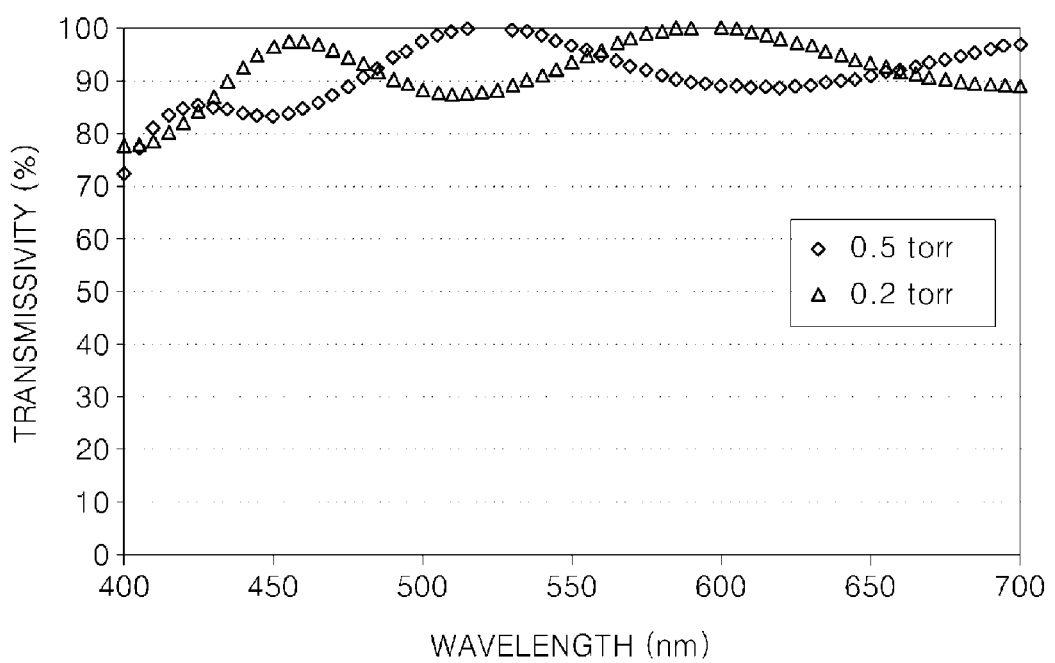
FIG. 4 is a graph showing the transmissivity of the embodiment of a passivation film as shown in FIG. 2.

FIG. 4 is a graph showing transmissivity measured in a visible light range with respect to the embodiment of a passivation film shown in FIG. 2.

Referring to FIG. 4, it is seen that the transmissivity of the plasma-processed passivation film in a visible light range is approximately 70%, and the transmissivities of blue light (near 450 nm), green light (near 550 nm), and red light (near 660 nm) respectively are approximately 85% or above.

Figure 5:
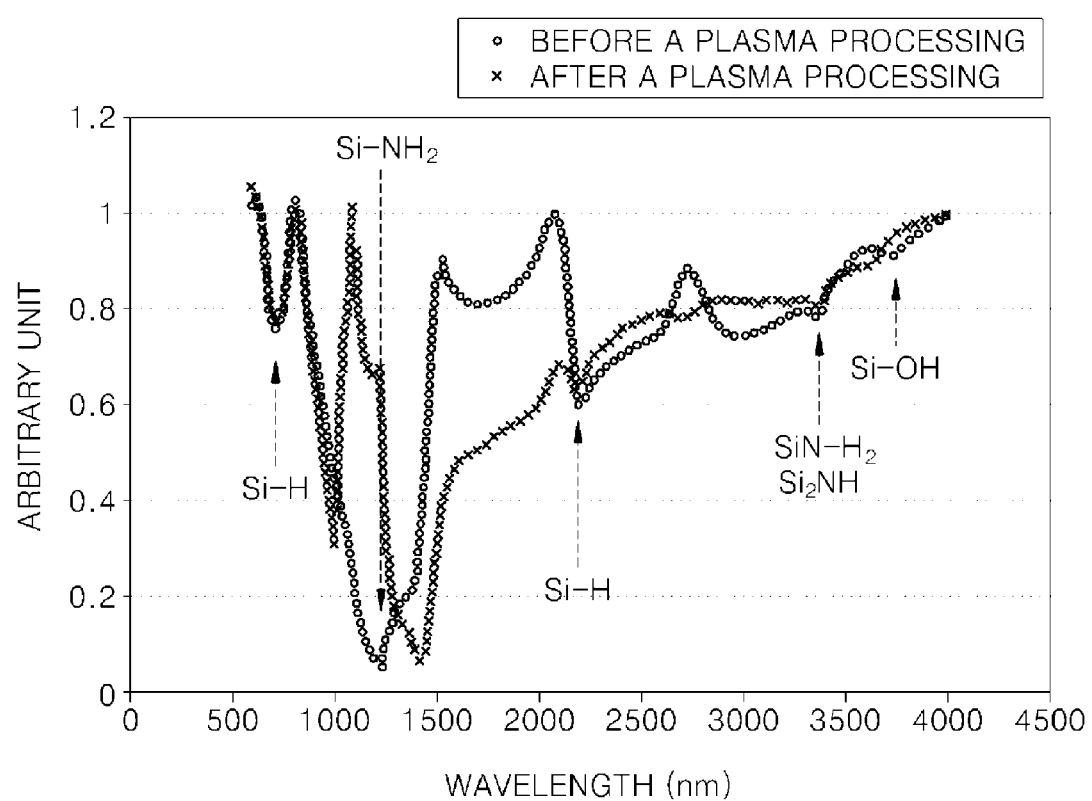
FIG. 5 is a graph showing the hydrogen content before and after plasma processing of the embodiment of a passivation film as shown in FIG. 2.

FIG. 5 is a graph showing hydrogen content measured before and after a plasma processing of the embodiment of a passivation film shown in FIG. 2 by a Fourier Transform Infrared (FT-IR) spectrometer.

Referring to FIG. 5, it is observed that a Si—H peak is reduced in a 2,200 nm region of the X-axis after plasma processing. The reduction of hydrogen content denotes that density at a surface of the passivation film is increased.

Figure 6:
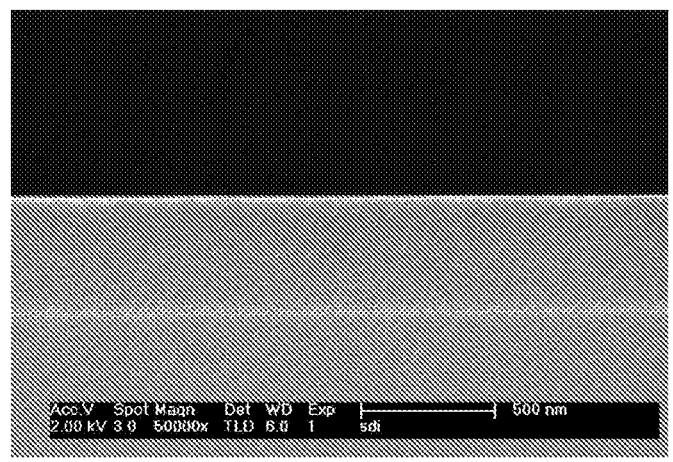
FIG. 6 is a scanning electron microscope (SEM) image of a cross-section of the embodiment of a passivation film as shown in FIG. 2.

FIG. 6 is a scanning electron microscope (SEM) image of a cross-section of the embodiment of a passivation film shown in FIG. 2.

FIG. 6 shows a cross-section of a silicon nitride film deposited on a substrate and a plasma-processed film. The plasma-processed film has a thickness in a range from about 470 to about 500 nm, and a boundary between the silicon nitride film and the plasma-processed film is not clearly seen in the cross-sectional shape of the passivation film after a plasma processing but seen as if they were a single film. The cross-sectional shape of the passivation film denotes that the stress of the passivation film may be mitigated by a plasma processing.

Figure 7A:
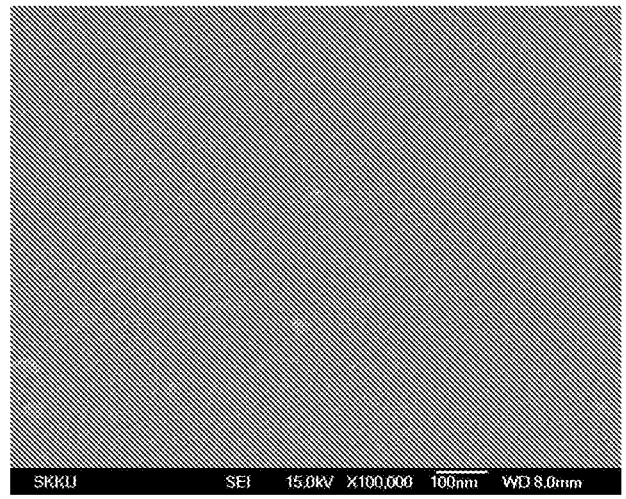
FIGS. 7A and 7B are SEM images of a surface of the embodiment of a passivation film as shown in FIG. 2, before and after plasma processing of the surface.
Figure 7B:
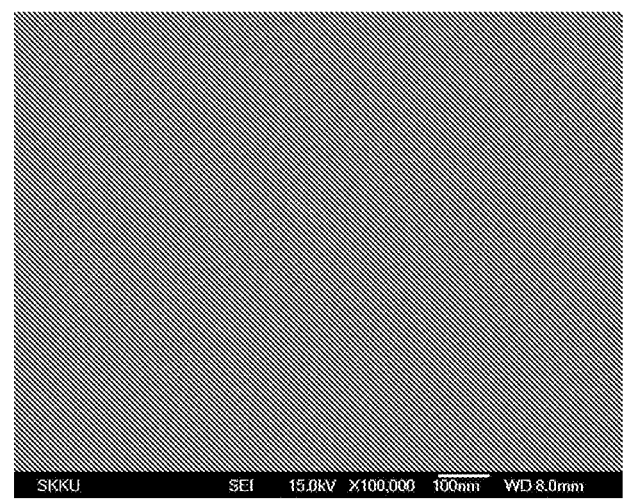

FIGS. 7A and 7B are SEM images of a surface of the embodiment of a passivation film shown in FIG. 2 before and after a plasma processing.

Referring to FIGS. 7A and 7B, it is seen that the surface of the passivation film is clean and smooth by removing impurities of the passivation film after a plasma processing.

Working Example 3

A first silicon nitride film having a thickness of about 0.4 μm was formed on a substrate having an organic light-emitting device by a PECVD method using a SiH$_4$ gas, a H$_2$ gas, and an N$_2$ gas. A first plasma-processed film having a thickness of about 0.15 μm was formed by plasma processing a surface of the first silicon nitride film by a PECVD method using an NH$_3$ gas, an N$_2$ gas, and a H$_2$ gas. A second silicon nitride film having a thickness of about 0.4 μm was formed on the first plasma-processed film using the same method used to form the first silicon nitride film. A second plasma-processed film was formed by plasma processing a surface of the second silicon nitride film using the same method used to form the first plasma-processed film. Next, a third silicon nitride film having a thickness of about 0.4 μm was formed on the second plasma-processed film using the same method used to form the first silicon nitride film.

The plasma processing was performed with an RF power of about 600 W, at pressures of about 0.5 and about 0.2 torr, and at a substrate temperature of about 100° C. Table 3 summarizes stresses and refractive indexes of the passivation film obtained as above according to pressure.

TABLE 3

| Pressure (torr) | Stress ($10^9$ dyne/cm$^2$): before→after plasma processing |
|---|---|
| 0.5 | Compressive 2.0 → Compressive 1.55 |
| 0.2 | Compressive 2.0 → Compressive 1.53 |

Referring to Table 3, the silicon nitride film before a plasma processing has a compressive stress characteristic since the silicon nitride film is dense, and still has a compressive stress characteristic after a plasma processing. The stress values that were compressive before a plasma processing are further reduced after a plasma processing, that is, it is seen that a tensile characteristic is increased after a plasma processing.

Figure 8:
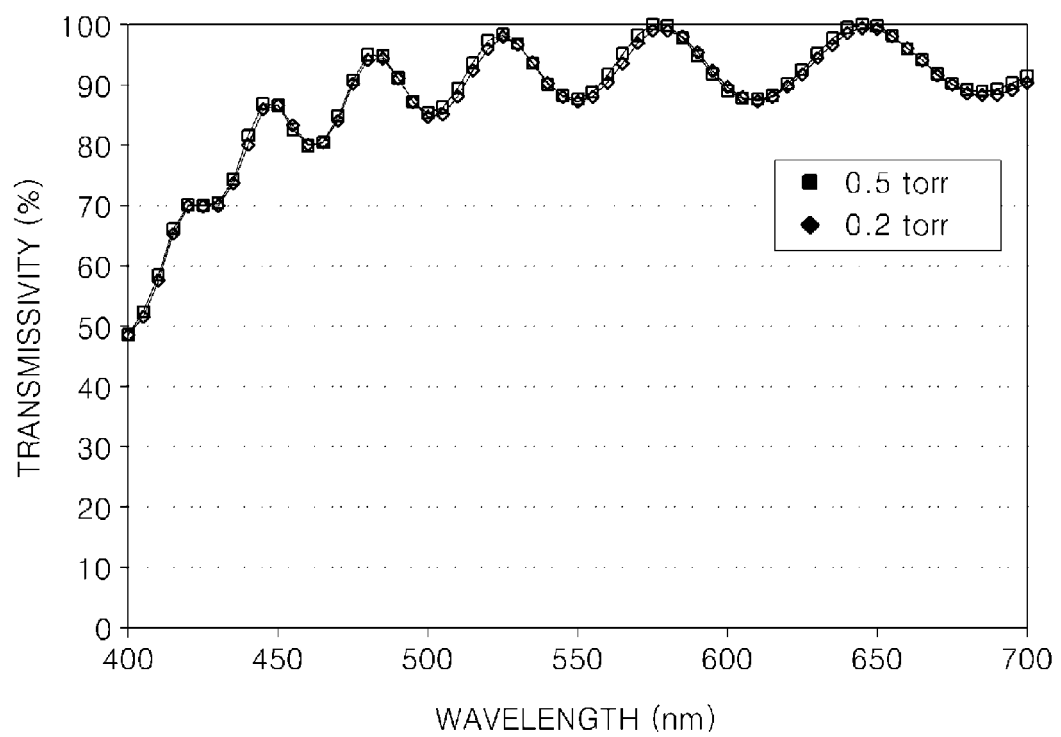
FIG. 8 is a graph showing the transmissivity of the embodiment of a passivation film as shown in FIG. 3.

FIG. 8 is a graph showing the transmissivity of the embodiment of a passivation film shown in FIG. 3 in a visible light range.

Referring to FIG. 8, the transmissivity of the passivation film in a visible light range according to the plasma processing is approximately 50% or above, and the transmissivities in a blue light region, a green light region, and a red light region respectively are approximately 80% or above.

Figure 9A:
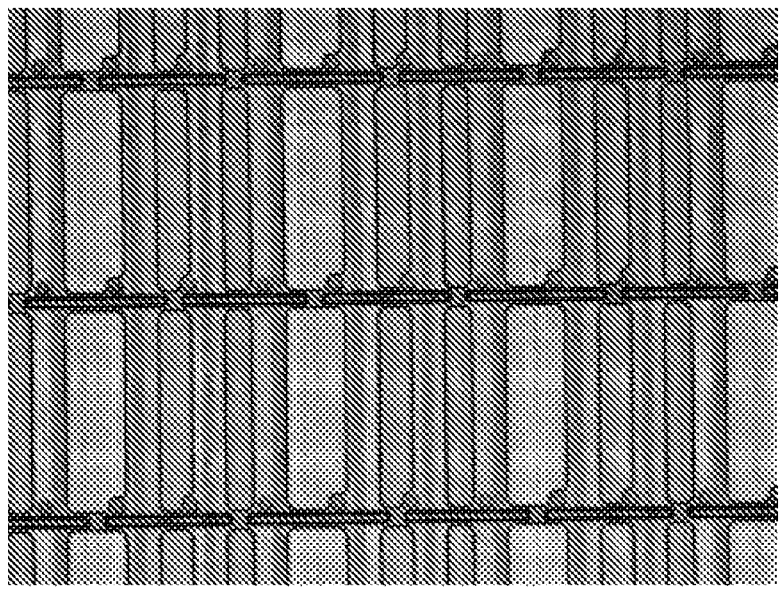
FIGS. 9A and 9B are SEM images of lighting of an organic light-emitting device having the embodiment of a passivation film as shown in FIG. 3, over time.
Figure 9B:
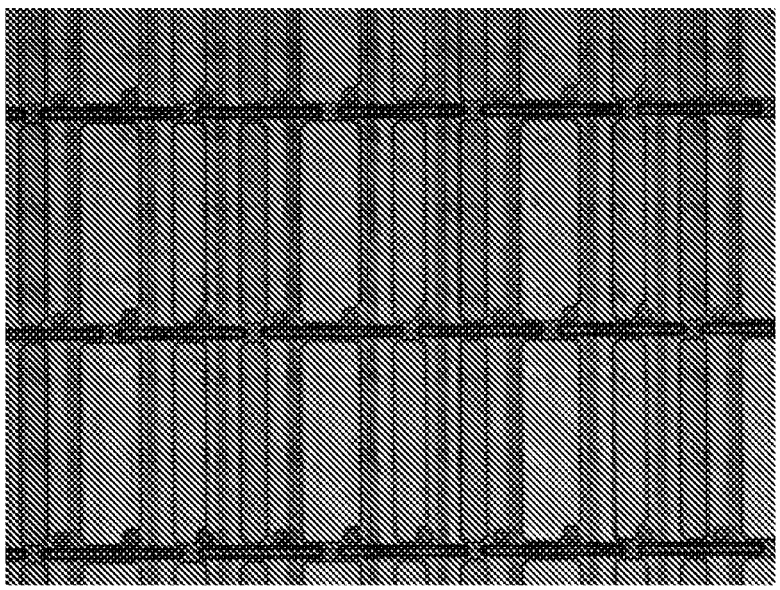

FIGS. 9A and 9B are SEM images of lighting of an organic light-emitting device having the embodiment of a passivation film shown in FIG. 3, over time. The organic light-emitting device is formed using a passivation film having a plasma-processed film that is formed under a pressure of about 0.9 torr during a plasma processing. Referring to FIGS. 9A and 9B, it is seen that there are no micro dark spots after about 380 hours of lighting of the organic light-emitting device.

Figure 10A:
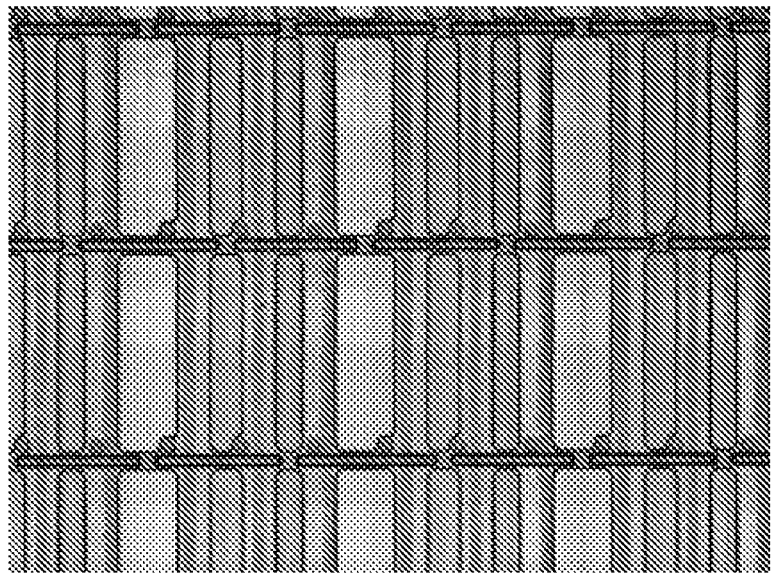
FIGS. 10A and 10B are SEM images of lighting of an organic light-emitting device having a passivation film that is not plasma processed, over time.
Figure 10B:
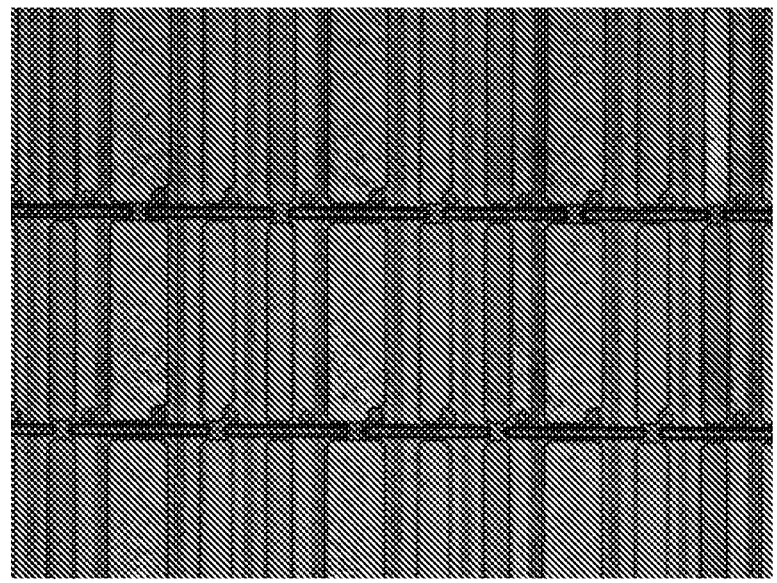

FIGS. 10A and 10B are SEM images of lighting of an organic light-emitting device having a passivation film that is not plasma processed after about 380 hours of lighting of the organic light-emitting device at a temperature of about 85° C. with high humidity. Referring to FIGS. 10A and 10B, it is seen that micro dark spots are generated after about 380 hours of lighting of the organic light-emitting device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A passivation film for an electronic device comprising:
   a nitride film formed on a substrate by using a silicon-containing gas and a nitrogen-containing gas, wherein the nitride film has a thickness in a range from about 0.5 to about 1.5 μm; and
   a plasma-processed film formed by plasma processing a surface of the nitride film using an NH$_3$ gas, an N$_2$ gas, and a H$_2$ gas.

2. The passivation film of claim 1, wherein the nitride film comprises at least one of a silicon nitride film and a silicon carbon nitride film.

3. The passivation film of claim 1, wherein a Si—H bond peak in the plasma-processed film in a 2,200 nm region is reduced.

4. The passivation film of claim 1, wherein the tensile stress characteristic of the passivation film is increased by the plasma processing.

5. The passivation film of claim 1, wherein the passivation film has a refractive index of about 70% or more in a visible light region.

6. The passivation film of claim 1, wherein the plasma-processed film has a thickness in a range from about 0.02 to about 0.8 μm.

7. A passivation film for an electronic device comprising:
a nitride film formed on a substrate by using a silicon-containing gas and a nitrogen-containing gas, wherein the nitride film comprises a first nitride film; and
a plasma-processed film formed by plasma processing a surface of the nitride film using an $NH_3$ gas, an $N_2$ gas, and a $H_2$ gas, wherein the plasma-processed film comprises a first plasma-processed film, and a second nitride film formed by plasma processing a surface of the first plasma-processed film using a silicon-containing gas and a nitrogen-containing gas.

8. The passivation film of claim 7, further comprising a second plasma-processed film formed by plasma processing a surface of the second nitride film using an $NH_3$ gas, an $N_2$ gas, and a $H_2$ gas and a third nitride film formed by plasma processing a surface of the second plasma-processed film using a silicon-containing gas and a nitrogen-containing gas.

9. A method of manufacturing a passivation film for an electronic device, the method comprising:
forming a nitride film on a substrate by a plasma-enhanced chemical vapor deposition (PECVD) method using a silicon-containing gas and a nitrogen-containing gas, wherein the nitride film has a thickness in a range from about 0.5 to about 1.5 μm; and
plasma processing a surface of the nitride film by a PECVD method using an $NH_3$ gas, an $N_2$ gas, and a $H_2$ gas.

10. The method of claim 9, wherein the nitride film comprises at least one of a silicon nitride film and a silicon carbon nitride film.

11. The method of claim 9, wherein the silicon-containing gas in the forming of the nitride film is a $SiH_4$ gas.

12. The method of claim 9, wherein the plasma processing is performed under a pressure condition in a range from about 0.1 to about 10 torr.

13. The method of claim 9, wherein the plasma processing is performed with a radio frequency (RF) power in a range from about 50 to about 1,000 W.

14. The method of claim 9, wherein the plasma processing is performed at a temperature of the substrate in a range from about 50 to about 200° C.

15. A method of manufacturing passivation film for an electronic device, the method comprising:
forming a nitride film on a substrate by a plasma-enhanced chemical vapor deposition (PECVD) method using a silicon-containing gas and a nitrogen-containing gas;
plasma processing a surface of the nitride film by a PECVD method using an $NH_3$ gas, an $N_2$ gas, and a $H_2$ gas; and
forming a second nitride film on a first plasma-processed film by a PECVD method using a silicon-containing gas and a nitrogen-containing gas.

16. The method of claim 15, further comprising:
forming a second plasma-processed film by plasma processing a surface of the second nitride film by a PECVD method using an $NH_3$ gas, an $N_2$ gas, and a $H_2$ gas; and
forming a third nitride film on the second plasma-processed film by plasma processing a surface of the second plasma-processed film by a PECVD method using a silicon-containing gas and a nitrogen-containing gas.

\* \* \* \* \*